United States Patent [19]
Stengel et al.

[11] Patent Number: 6,106,563
[45] Date of Patent: Aug. 22, 2000

[54] METHOD AND APPARATUS FOR EXTRACTING PARAMETERS FOR AN ELECTRICAL STRUCTURE

[75] Inventors: Robert E.. Stengel, Pompano Beach; David E. Bockelman, Weston, both of Fla.; Lei Zhao, Albuquerque, N. Mex.

[73] Assignee: Motorola, Inc., Schaumburg, Ill.

[21] Appl. No.: 08/939,117

[22] Filed: Sep. 26, 1997

[51] Int. Cl.$^7$ .............................. G06F 17/50; G06G 7/62
[52] U.S. Cl. ................................ 703/13; 703/2; 703/4; 716/4; 324/612; 324/638
[58] Field of Search ................ 395/500.34, 500.39; 324/638, 612, 601; 703/2, 13, 14; 716/4

[56] References Cited

U.S. PATENT DOCUMENTS

| | | | |
|---|---|---|---|
| 5,349,539 | 9/1994 | Moriyasu | 364/578 |
| 5,467,291 | 11/1995 | Fan et al. | 364/578 |
| 5,495,173 | 2/1996 | Bockelman et al. | 324/625 |
| 5,751,153 | 5/1998 | Bockelman | 324/638 |

OTHER PUBLICATIONS

Bockelman, David E. and William R. Eisenstadt, "Combined Differential and Common–Mode Analysis of Power Splitters and Combiners," The Institute of Electrical and Electronic Engineers Transactions on Microwave Theory and Techniques, vol. 43, No. 11 (Nov. 1995), pp. 2627–2632.

Bockelman et al, "Pure–Mode Network Analyzer for On–Wafer Measurements of Mixed–Mode S–Parameters of Differential Circuits", IEEE Transactions on Microwave Theory and Techniques, pp. 1071–1077, Jul. 1997.

*Primary Examiner*—Kevin J. Teska
*Assistant Examiner*—Samuel Broda
*Attorney, Agent, or Firm*—Andrew S. Fuller

[57] ABSTRACT

A parameter extraction technique for an electrical structure is based on a definition of network parameters that isolates pure mode responses of the electrical structure, and that makes mode conversion responses of the electrical structure negligible. A set of network parameters is obtained that represents pure mode responses for the electrical structure (410). These network parameters are processed to obtain model parameters that characterize each pure mode response (422, 424, 426, 428, 432, 434, 436, 438). Preferably, the mode specific parameters to combined to obtain mode independent parameters, such as coupling factor, propagation constant, and characteristic impedance values (440, 450).

8 Claims, 4 Drawing Sheets

METHOD AND APPARATUS FOR EXTRACTING PARAMETERS FOR AN ELECTRICAL STRUCTURE

TECHNICAL FIELD

This invention relates in general to electrical circuit modeling, and more particularly, to parameter extraction techniques.

BACKGROUND

Behavioral model parameters are often used to understand the electrical and physical characteristics of components, circuits, and systems, required for a particular application. For example, the performance of a particular circuit component in a given circuit may be determined by employing model parameters to simulate that component. The prior art describes a number of approaches for obtaining parameters which vary in degrees of complexity, and effectiveness. A typical approach involves the use of network analyzers to measure the electrical response of a circuit, and to derive parameters based on this response. Substantial work has been done to characterize two-port devices in this manner.

Recently, there has been a significant increase in interest in characterizing differential and other multi-port devices. Of particular interest is the ability to understand the behavior of electrical structures having coupled signal lines. Multilayer ceramic couplers are examples of such structures. The prior art does not provide an adequate solution for quickly and accurately extracting parameters for these electrical structures. Therefore, a new approach for extracting behavioral model parameters is needed.

DETAILED DESCRIPTION OF THE PREFERRED EMBODIMENT

Figure 1:
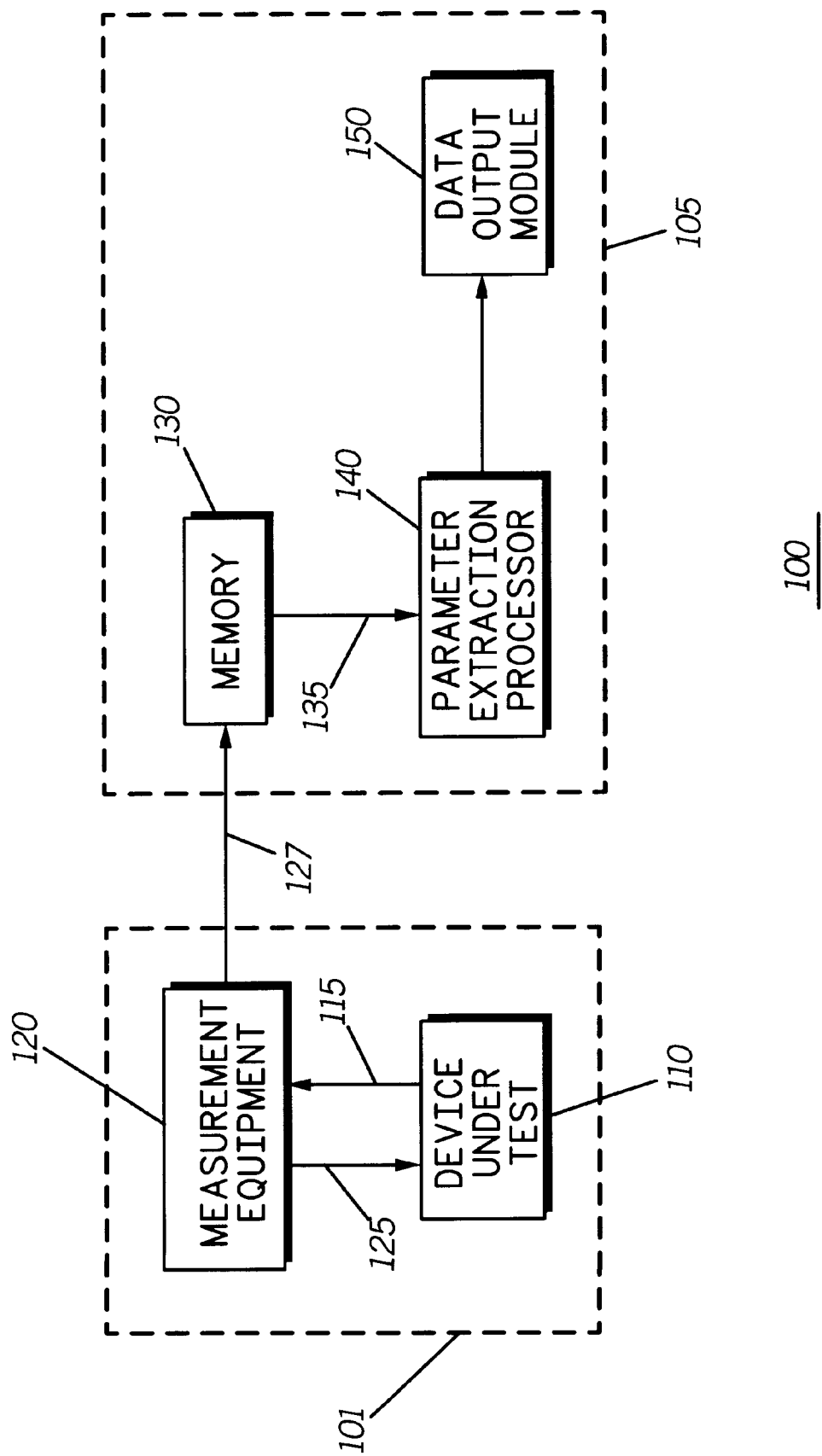
FIG. 1 shows a block diagram of a first embodiment of a system for extracting parameters from an electrical structure, in accordance with the present invention.

The present invention provides for parameter extraction for an electrical structure. This parameter extraction is based on a definition of network parameters in which mode conversion responses of the electrical structure are negligible, thereby allowing for isolation of the pure mode responses. In operation, a set of network parameters is obtained that represents pure mode responses for the electrical structure. These network parameters are processed to obtain model parameters that characterize each pure mode response. Model parameters refer to electrical design parameters, distributed parameters, physical parameters, and the like, that are used to characterize or model particular circuitry, or portion of circuitry, in an abstract manner. The parameter extraction technique described herein is particularly suitable for modeling linear networks.

In the preferred embodiment, the definition of network parameters corresponds to mixed-mode scattering parameters (s-parameters) that represent differential mode, common mode, and mode conversion responses for the electrical structure. The mixed-mode s-parameters are obtained such that the mode conversion responses are negligible. In one embodiment, the mixed-mode s-parameters are used to obtain electrical design parameters, such as a coupling coefficient, a characteristic impedance, and a propagation constant for each pure mode response. These mode specific electrical design parameters are then combined to provide corresponding mode independent parameters. In another embodiment, the mixed-mode s-parameters are processed to obtain mode specific distributed parameters. In yet another embodiment, the mixed-mode s-parameters are used to obtain physical dimensions for components of the electrical structure.

The definition of network parameters suitable for a given electrical structure is a significant aspect of the present invention. Preferably, the network parameters are defined to isolate the pure mode responses of the electrical structure, and to make negligible the mode conversion responses. In the preferred embodiment, the network parameters are s-parameters derived with respect to a reference base of a differential electrical structure having a transmission line comprising a coupled pair of signal lines. When the transmission line is stimulated by a differential signal, a differential mode voltage ($V_d$) exists as the difference between voltages $V_1$ and $V_2$ at a particular point, x, on the transmission line, where the subscripts (1, 2) represent corresponding points on the coupled pair of signal lines. Thus, $$V_d(x) = V_1 - V_2.$$

A corresponding differential mode current ($I_d$) is defined as one-half (½) the difference between the respective currents $I_1$, $I_2$ traversing the coupled signal lines. Thus, $$I_d(x) = \tfrac{1}{2}(I_1 - I_2).$$

A common mode voltage ($V_c$) on differential transmission line is defined with respect to the particular point as one-half (½) the sum of the respective voltages. Thus, $$V_c(x) = \tfrac{1}{2}(V_1 + V_2).$$

The corresponding common mode current ($I_c$) is the total current flowing on both signal lines. Thus, $$I_c(x) = I_1 + I_2.$$

The characteristic impedance of each mode ($Z_d$, $Z_c$) can be defined as a ratio of the forward propagating wave component ($V_d^+$, $V_c^+$) of the voltage ($V_d$, $V_c$) to the forward propagating wave component ($I_d^+$, $I_c^+$) of the current ($I_d$, $I_c$) of the appropriate modes at any point, x, along the transmission line. Thus, $$Z_d = V_d^+(x)/I_d^+(x);$$

$$Z_c = V_c^+(x)/I_c^+(x);$$

These values can be used to derive normalized wave equations.

Imposing the condition of low-loss transmission lines on the coupled pair, the characteristic impedances are approximately purely real. Under this condition, $Z_d \approx R_d$, and $Z_c \approx R_c$, where $R_d$ and $R_c$ are the real portions of $Z_d$ and $Z_c$, respectively. For a differential electrical structure having first and second ports, the normalized wave equations at the first port (x=0) can be stated as:

$$a_{d_1} = \frac{1}{2\sqrt{R_d}}[V_d(x) + I_d(x)R_d]\big|_{x=0}$$

$$b_{d_2} = \frac{1}{2\sqrt{R_d}}[V_d(x) - I_d(x)R_d]\big|_{x=0}$$

$$a_{c_1} = \frac{1}{2\sqrt{R_c}}[V_c(x) + I_c(x)R_c]\big|_{x=0}$$

$$b_{c_2} = \frac{1}{2\sqrt{R_c}}[V_c(x) - I_c(x)R_c]\big|_{x=0}.$$

A similar derivation can be made for the second port.

Mixed-mode scattering parameters can be represented by a matrix [S], such that:

$$[b]=[S][a];$$

where [a] and [b] denote n-dimensional column vectors, and [S] denotes an n-by-n matrix. The generalized mixed-mode two-port s-parameters can be stated as:

$$\begin{bmatrix} b_{d_1} \\ b_{d_2} \\ b_{c_1} \\ b_{c_2} \end{bmatrix} = \begin{bmatrix} S_{dd} \mid S_{dc} \\ S_{cd} \mid S_{cc} \end{bmatrix} \begin{bmatrix} a_{d_1} \\ a_{d_2} \\ a_{c_1} \\ a_{c_2} \end{bmatrix}$$

where $[S_{dd}]$ is a 2-by-2 matrix of s-parameters representing the pure differential mode response of the electrical structure, $[S_{cc}]$ is a 2-by-2 matrix of s-parameters representing the pure common mode response of the electrical structure, $[S_{dc}]$ and $[S_{cd}]$, are matrices of s-parameters representing mode conversion or cross-mode responses of the electrical structure. In particular, $[S_{dc}]$ describes the conversion of common mode waves into differential mode waves, and $[S_{cd}]$ describes the conversion of differential mode waves into common mode waves. For substantially differential circuits, the mode conversion matrices $[S_{dc}]$, $[S_{cd}]$ ordinarily contains zeroes or negligible values.

The derivation of mixed-mode s-parameters for differential structures is described in U.S. Pat. No. 5,495,173, issued to Bockelman et al. on Feb. 27, 1996, for a Method And Apparatus Characterizing A Differential Circuit, the entire contents of which are hereby incorporated by reference. Similar derivations can be made to obtain network parameters that isolate pure mode responses of other types of electrical structures.

For an ideal differential circuit, a set of mixed-mode s-parameters ($S_{MIX}$) represents a definition of network parameters having negligible or zero mode conversion values. These mixed-mode s-parameters may be generated by a mathematical transformation of well known standard s-parameters ($S_{STD}$), as follows:

$$S_{MIX} = M\, S_{STD} M^{*T};$$

where M is a matrix defined as:

$$M = \frac{1}{\sqrt{2}} \begin{bmatrix} 1 & -1 & 0 & 0 \\ 0 & 0 & 1 & -1 \\ 1 & 1 & 0 & 0 \\ 0 & 0 & 1 & 1 \end{bmatrix};$$

and ($^{*T}$) represents a transpose and complex conjugate of the matrix M.

The above concept can be extended to define network parameters $S_X$ having negligible or zero mode conversion values for an arbitrary four-port circuit by an appropriate transformation matrix $M_X$ applied to standard four-port s-parameters $S_{STD}$. The relevant values can be developed as follows:

Let, $$M_X = \begin{bmatrix} a_{11} & a_{12} & a_{13} & a_{14} \\ a_{21} & a_{22} & a_{23} & a_{24} \\ a_{31} & a_{32} & a_{33} & a_{34} \\ a_{41} & a_{42} & a_{43} & a_{44} \end{bmatrix};$$

where $a_{ij}$ represent complex numbers.

Let, $$S_X = M_X S_{STD} M_X^{*T}.$$

Partition $S_X$ such that all partitions are two-by-two (2×2) matrices. Thus, $$S_X = \begin{bmatrix} S_{11} \mid S_{12} \\ S_{21} \mid S_{22} \end{bmatrix};$$

where $S_{11}$, $S_{12}$, $S_{21}$, and $S_{22}$ are two-by-two (2×2) matrices. Modes are then defined by finding all $a_{ij}$ such that:

$$[S_{12}]=[0] \text{ and } [S_{21}]=[0].$$

This operation forces mode conversion values to be zeroes. The values for the matrix $M_X$ can then be derived using the above equation and appropriate values for $S_{STD}$ determined through measurement, simulation, or the like. The rows of $M_X$ define the new modes in terms of single ended waves.

FIG. 1 shows a block diagram of a first embodiment 100 of a system for extracting parameters from an electrical structure, in accordance with the present invention. A measurement system 120 has equipment coupled to a device under test (DUT) 110 to provide a data source 101. The data source 101 is coupled to a computer processing system 105 that includes a memory 130, a parameter extraction processor 140, and a data output module 150. In the preferred embodiment, the DUT 110 is an electrical structure comprising coupled transmission lines. The measurement equipment is capable of developing mixed-mode s-parameters from data generated from the DUT 110. In operation, the measurement equipment 120 stimulates the DUT 110 using differential and common mode input signals 125. The DUT 110 provides corresponding differential and common mode output signals 115 to the measurement equipment 120. The measurement equipment 120 provides mixed-mode s-parameters 127 which are stored in the memory 130. Thus, in the preferred embodiment, the mixed-mode measurement system 120 operates to stimulate the particular electrical structure 110 and to generate therefrom a set of mixed-mode scattering parameters that comprises distinct sets of network description parameters.

Figure 2:
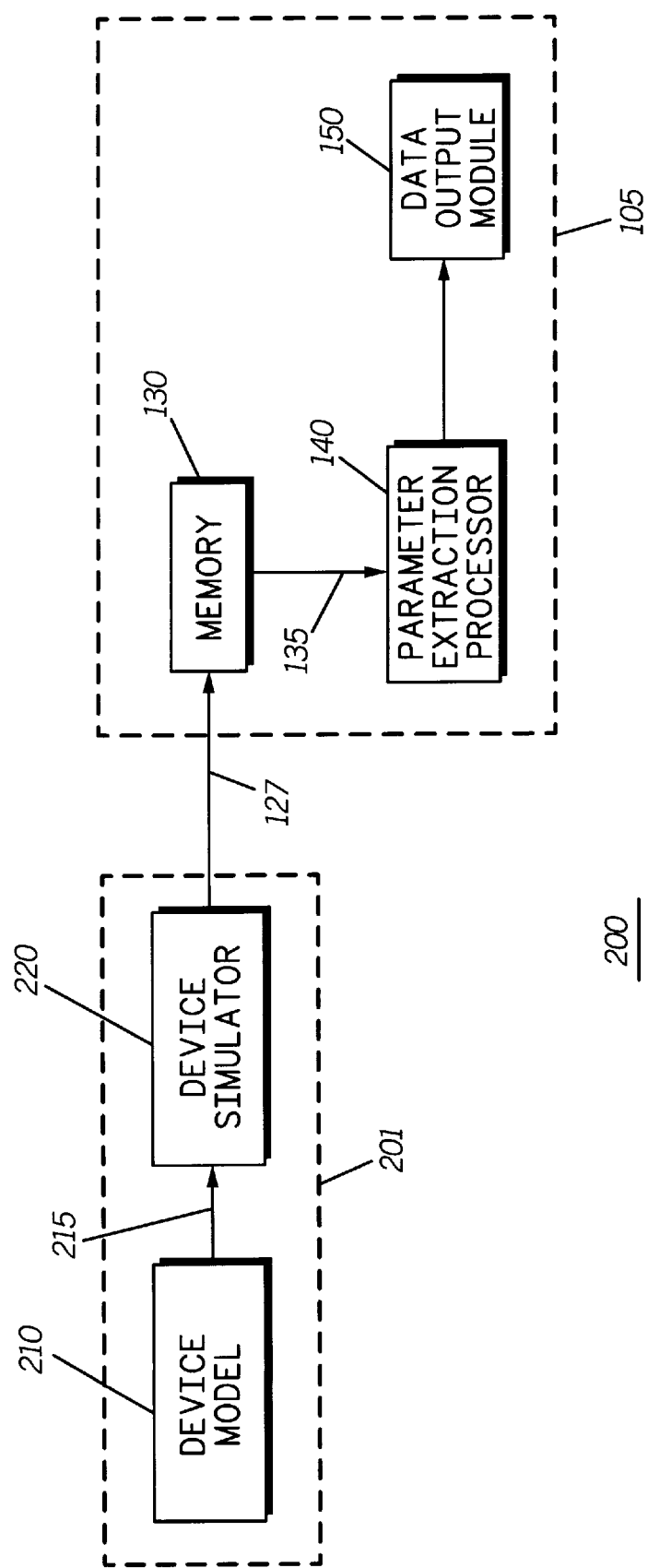
FIG. 2 shows a block diagram of a second embodiment of a system for extracting parameters that uses a simulated electrical structure, in accordance with the present invention.

FIG. 2 shows a block diagram of a second embodiment 200 of a system for extracting parameters that uses a simulated electrical structure, in accordance with the present invention. Here, a device simulator 220 is coupled to a device model 210 to provide a data source 201. The device simulator 220 uses the device model 210, which provides data 215 characterizing a particular electrical structure, to simulate characteristic responses of the modeled electrical structure. The device model 210 may represent a physical model of the electrical structure. Preferably, the device simulator 220 operates to provide these characteristic responses in accordance with a definition of network parameters that isolate pure mode responses. In the preferred embodiment, the simulator models the particular electrical structure and generates therefrom a set of mixed-mode scattering parameters that comprises distinct sets of network description parameters. As in FIG. 1, the data source 201 provides network parameters 127 to the memory 130 of the computer processing system 105.

Referring to FIG. 1 and FIG. 2, the memory 130 contains distinct sets of network description parameters that characterize pure mode responses of the electrical structure 110, or the structure represented by the device model 210. In the preferred embodiment, the distinct sets of network parameters correspond to the $[S_{dd}]$ and $[S_{cc}]$ matrices described above, which represent the pure differential mode response, and the pure common mode response of a differential circuit. The parameter extraction processor 140 is coupled to the memory 130 and has an input 135 of the distinct sets of network description parameters. The processor is responsive to the input 135 to process each distinct set of network description parameters to obtain mode specific model parameters, and to generate mode independent model parameters based on a combination of the respective mode specific model parameters. The model parameters generated from the parameter extraction processor 140 are coupled to the data output module 150 for display or for further processing.

Figure 3:
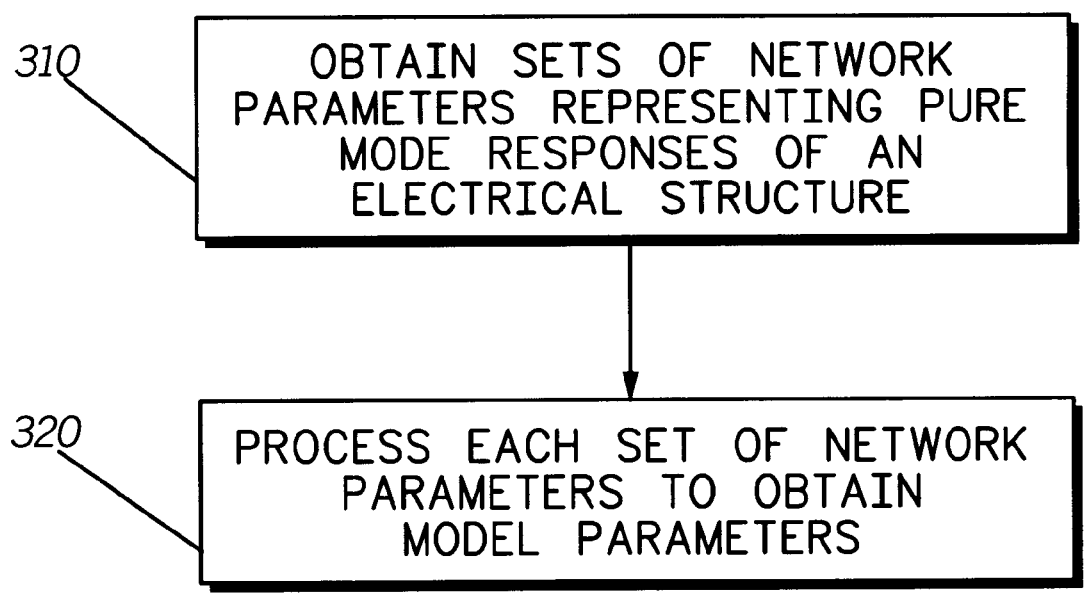
FIG. 3 is a summary of procedures used to obtain model parameters, in accordance with the present invention.

FIG. 3 is a summary of procedures 300 used to obtain model parameters, in accordance with the present invention. Sets of network parameters are obtained which represent pure mode responses of an electrical structure, based on a definition of network parameters in which mode conversion responses of electrical structure are negligible, step 310. These network parameters may be derived from direct measurements taken from a stimulated electrical structure, or from data generated by a simulator configured using an appropriate device model. Each set of network parameters is processed to obtain model parameters that characterize pure mode response, step 320.

Figure 4:
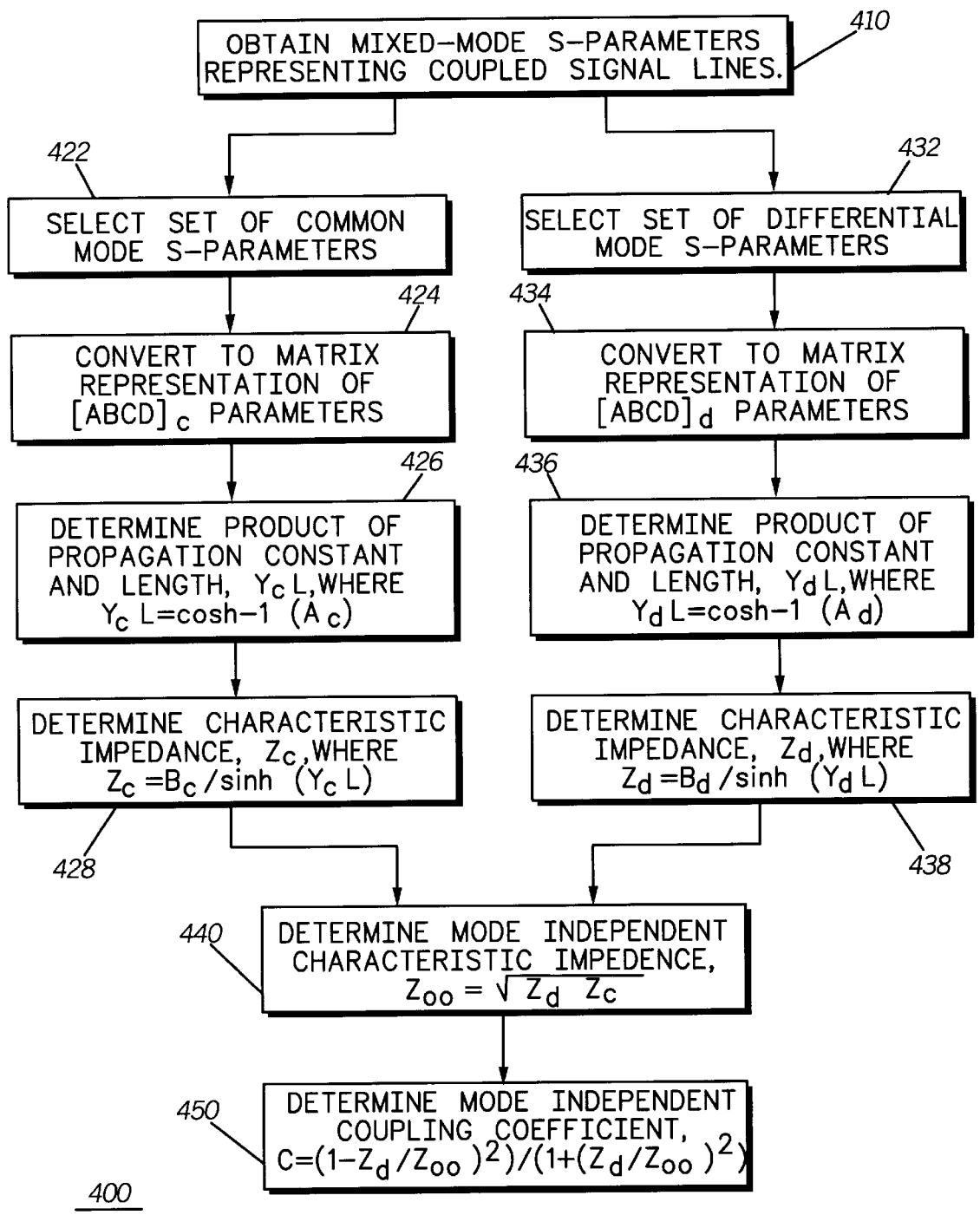
FIG. 4 is a summary of procedures used to derive model parameters from mixed-mode s-parameters, in accordance with the present invention.

FIG. 4 is a summary of procedures 400 used to derive model parameters of coupled transmission lines from mixed-mode s-parameters, in accordance with the present invention. Network parameters are obtained which represent an electrical structure, step 410. In the preferred embodiment, the network parameters are mixed-mode s-parameters, and the electrical structure comprises coupled transmission or signal lines having a differential mode response and a common mode response. According to one embodiment, the mixed-mode s-parameters are generated from direct measurement of differential and common mode output waves of a differentially stimulated circuit. According to another embodiment, the mixed-mode s-parameters are generated from a mathematical transformation of multi-port s-parameters derived for a particular circuit, such as described above. According to yet another embodiment, the mixed-mode s-parameters are generated from a simulated circuit. The mixed-mode s-parameters are processed to obtain mode specific parameters, included propagation constant and characteristic impedance values for differential mode and common mode based signal propagation.

For common mode specific parameters, a set of common mode s-parameters is selected from the mixed-mode s-parameters, step 422. The s-parameters representing the common mode response are converted into a matrix of ABCD parameters, step 424. The ABCD parameters can be represented in matrix form as:

$$\begin{bmatrix} A_c & B_c \\ C_c & D_c \end{bmatrix};$$

where $A_c$, $B_c$, $C_c$, and $D_c$ represent common mode parameter values. The value $A_c$ is used to determine a product of propagation constant and length ($\gamma_c L$), step 426, where:

$$\gamma_c L = \cosh^{-1}(A_c).$$

The value $B_c$ and the product $\gamma_c L$ are used to determine a characteristic impedance ($Z_c$), step 428, where:

$$Z_c = B_c / \sinh(\gamma_c L).$$

Similarly, for differential mode specific parameters, a set of differential mode s-parameters is selected from the mixed-mode s-parameters, step 432. The s-parameters representing the differential mode response are converted into a matrix of ABCD parameters, step 434. The ABCD parameters can be represented in matrix form as:

$$\begin{bmatrix} A_d & B_d \\ C_d & D_d \end{bmatrix};$$

where $A_d$, $B_d$, $C_d$, and $D_d$ represent differential mode parameter values. The value $A_d$ is used to determine a product of propagation constant and length ($\gamma_d L$), step 436, where:

$$\gamma_d L = \cosh^{-1}(A_d).$$

The value $B_c$ and the product $\gamma_d L$ are to used determine a characteristic impedance ($Z_d$), step 438, where:

$$Z_d = B_d / \sinh(\gamma_d L).$$

Alternatively, network parameters such as t-parameters may be used with reformulated equations to derive similar values.

The model parameters specific to each mode response are combined to obtain mode independent electrical design parameters. Thus, the mode specific characteristic impedances $Z_c$, $Z_d$ are used to determine a mode independent characteristic impedance, $Z_{oo}$, step 440, where:

$$Z_{oo} = \sqrt{Z_d Z_c}.$$

These values, $Z_c$, $Z_d$, and $Z_{oo}$, are used to determine a mode independent coupling coefficient, c, step 450, where:

$$c = \frac{1 - \left(\frac{Z_d}{Z_{oo}}\right)^2}{1 + \left(\frac{Z_d}{Z_{oo}}\right)^2}.$$

According to the present invention, the mixed-mode s-parameters are used to derive other model parameters. Particularly, mode specific distributed parameters are determined, including resistance per unit length ($R_c$, $R_d$), inductance per unit length ($L_c$, $L_d$), capacitance per unit length ($C_c$, $C_d$), and conductance per unit length ($G_c$, $G_d$) for a physical electrical model, based at least in part on the coupling coefficient, propagation constant, and characteristic impedance. These parameters can be derived using the following relationships:

$$Z_d = \sqrt{\frac{R_d + j\omega L_d}{G_d + j\omega C_d}};$$

$$\gamma_d = \sqrt{(R_d + j\omega L_d)(G_d + jwC_d)};$$

$$Z_c = \sqrt{\frac{R_c + j\omega L_c}{G_c + j\omega C_c}};$$

$$\gamma_c = \sqrt{(R_c + j\omega L_c)(G_c + jwC_c)}.$$

The mixed-mode s-parameters are also used to obtain physical model parameters. In particular, the mixed-mode s-parameters are used to determine physical dimensions for components of the electrical structure based at least in part on the mode specific distributed parameters and the electrical design parameters. A closed form function of mixed-mode parameters is developed in terms of the physical design elements. In one embodiment, field simulation software such as method of moments is used to solve for an array of physical implementations of the structure being considered. The array is over the set of physical parameters that are to be determined. For example, the physical parameters of a symmetrical broadside coupled stripline structure would be the conductor width (w), spacing between the coupled conductors (s), and the spacing between the ground planes enclosing the coupled conductors (b). Once the array of mixed-mode values are solved for the structure, a polynomial function is fitted to the measurements with the parameters w, s, and b in the polynomial relation. Subsequent mixed-mode measurements could then be used with these developed polynomial based relations to determine the physical values of the measured structure.

The present invention provides for significant benefits that facilitate the design of differential and other electrical structures. Model parameters extracted using the described techniques provide for more accurate and complete analysis of electrical designs. These model parameters can be derived for particular component, circuit, and system designs, and made available in libraries for use in the design of more complex circuits and systems.

What is claimed is:

1. A method of extracting parameters for circuitry having coupled signal lines, comprising the steps of:
   obtaining a set of mixed-mode s-parameters representing the coupled signal lines;
   processing the set of mixed-mode s-parameters to obtain mode specific parameters, including propagation constant and characteristic impedance values for differential mode and common mode based signal propagation; and
   combining the mode specific parameters to obtain mode independent parameters, including coupling factor, propagation constant, and characteristic impedance values.

2. The method of claim 1, wherein the step of obtaining comprises the step of generating mixed-mode parameters from a simulated circuit.

3. The method of claim 1, wherein the step of obtaining comprises the step of generating mixed-mode parameters from a mathematical transformation of multi-port s-parameters.

4. The method of claim 1, wherein the step of obtaining comprises the step of generating mixed-mode parameters from direct measurement of differential and common mode output waves of a differentially stimulated circuit.

5. The method of claim 1, wherein the step of processing comprises:
   converting a subset of the set of mixed-mode s-parameters representing a differential mode response into a first matrix of ABCD parameters, $$\begin{bmatrix} A_d & B_d \\ C_d & D_d \end{bmatrix};$$

determining a product of propagation constant and length ($\gamma_d L$) where:

$$\gamma_d L = \cosh^{-1}(A_d); \text{ and}$$

determining a characteristic impedance ($Z_d$), where:

$$Z_d = B_d / \sinh(\gamma_d L).$$

6. The method of claim 5, wherein the step of processing comprises:
   converting a subset of the set of mixed-mode s-parameters representing a common mode response into a second matrix of ABCD parameters, $$\begin{bmatrix} A_c & B_c \\ C_c & D_c \end{bmatrix};$$

determining a product of propagation constant and length ($\gamma_c L$) where:

$$\gamma_c L = \cosh^{-1}(A_c); \text{ and}$$

determining a characteristic impedance ($Z_c$), where:

$$Z_c = B_c / \sinh(\gamma_c L).$$

7. The method of claim 6, wherein the step of combining comprises the steps of:
   determining a mode independent characteristic impedance, $Z_{oo}$, where:

$$Z_{oo} = \sqrt{Z_d Z_c};$$

and
   determining a mode independent coupling coefficient, c, where:

$$c = \frac{1 - \left(\frac{Z_d}{Z_{oo}}\right)^2}{1 + \left(\frac{Z_d}{Z_{oo}}\right)^2}.$$

8. An apparatus for extracting parameters for modeling particular circuitry, comprising:
   means for obtaining a set of mixed-mode s-parameters for at least a portion of the particular circuitry, wherein the set of mixed-mode s-parameters comprise a first set of network description parameters specific to differential-mode and a second set of network description parameters specific to common-mode;

means for determining mode specific electrical design parameters from the first and second set of network description parameters individually; and means for combining the mode specific electrical design parameters to obtain a mode independent design parameters including coupling coefficient and characteristic impedance values.

* * * * *